United States Patent [19]

McCartin et al.

[11] 4,276,366

[45] Jun. 30, 1981

[54] PROCESS OF USING POSITIVE AND NEGATIVE WORKING IMAGING SYSTEMS FROM PHOTOACTIVE PLASTISOLS

[75] Inventors: Peter J. McCartin, Princeton Junction, N.J.; William J. Nebe, Wilmington, Del.

[73] Assignee: E. I. Du Pont de Nemours and Company, Wilmington, Del.

[21] Appl. No.: 168,153

[22] Filed: Jul. 14, 1980

Related U.S. Application Data

[62] Division of Ser. No. 950,307, Oct. 11, 1978.

[51] Int. Cl.³ .................................................. G03C 5/00
[52] U.S. Cl. .................................... 430/291; 430/269; 430/270; 430/281; 430/325; 430/330
[58] Field of Search ............... 430/269, 270, 281, 286, 430/287, 330, 325, 291

[56] References Cited

U.S. PATENT DOCUMENTS

| | | | |
|---|---|---|---|
| 2,600,122 | 6/1952 | Meyer et al. | 260/34.2 |
| 2,618,621 | 11/1952 | Burt | 260/31.4 |
| 3,429,852 | 2/1969 | Shoultchi | 260/47 |
| 3,795,649 | 3/1974 | May | 260/31.3 |
| 4,125,700 | 11/1978 | Graham | 204/159.16 |

FOREIGN PATENT DOCUMENTS 1167683 10/1969 United Kingdom .

*Primary Examiner*—Jack P. Brammer

[57] ABSTRACT

Photoactive, thermally coalescible resin plastisol dispersions comprising a polyvinyl chloride polymer having attached to the polymer backbone photopolymerizable or photocrosslinkable groups dispersed in a liquid plasticizer medium, and a photoinitiator which is either a separate component or a photoactive substituent present on the polymer backbone. The photoactive plastisols, in element form, can be used in an image formation process that is a positive working washout or negative toned imaging system.

11 Claims, No Drawings

PROCESS OF USING POSITIVE AND NEGATIVE WORKING IMAGING SYSTEMS FROM PHOTOACTIVE PLASTISOLS

This is a division of application Ser. No. 950,307, filed Oct. 11, 1978.

DESCRIPTION

1. Technical Field

This invention relates to photoactive plastisol dispersions and more particularly to photoactive polyvinyl chloride plastisol dispersions useful in positive and negative working imaging systems.

2. Background Art

H. A. Sarvetnick, "Plastisols and Organosols", Van Nostrand Reinhold Company, New York (1972), describes plastisols as fluid mixtures, ranging in viscosity from pourable liquids to heavy pastes, obtained by dispersing polymeric resin particles in nonvolatile, nonaqueous liquid plasticizers, i.e., materials which are compatible with the polymer or resin and increase its workability and flexibility but are not solvents for the resin or polymer under ordinary conditions of storage. When the plastisol has been formed into a desired shape, e.g., by molding or coating, it can be heated to coalesce the polymeric resin particles and the nonvolatile liquid constituent, thereby forming a homogeneous mass. Volatile diluents can be added to plastisol dispersions to modify their viscosity and to achieve desirable handling characteristics in coating or other forming operations. A dispersion that contains no more than 10% volatile diluent is regarded as a plastisol.

Polyvinyl chloride has been described in the literature as the primary polymer used in forming plastisols. Polyvinyl chloride plastisols have been described in U.S. Pat. No. 3,795,649 wherein the polyvinyl chloride is copolymerized with other monomers, including acrylic monomers, that constitute a minority ($<35\%$) of the polymer composition. In U.S. Pat. No. 2,618,621 there are disclosed polyvinyl chloride plastisols wherein part of the plasticizer content is replaced with an acrylic monomer, which is then conventionally thermally polymerized at the temperature encountered in the step of coalescing the polyvinyl chloride resin.

It has been found that polyvinyl chloride plastisol dispersions can be made photoactive by having attached to the backbone of the polyvinyl chloride polymer photopolymerizable or photocrosslinkable groups, such that upon exposure to actinic radiation, the modified polyvinyl chloride polymer becomes polymerized or crosslinked. Such photoactive plastisols, in element form, can be used in a process of image formation that may be a positive working washout imaging system or a negative toned imaging system.

DISCLOSURE OF INVENTION

In accordance with this invention there is provided a photoactive thermally coalescible polyvinyl chloride resin plastisol dispersion which comprises (a) a polyvinyl chloride polymer having attached to the backbone thereof photopolymerizable or photocrosslinkable groups, the polymer being dispersed in (b) a liquid medium that comprises a plasticizer for the polymer and is nonvolatile at room temperature, and (c) a photoactivatable initiator or initiator system present either as a separate component or as a photoactive substituent on the backbone of the polyvinyl chloride polymer, the initiator or initiator system being capable, upon exposure to actinic radiation, of causing polymerization or crosslinking of the photopolymerizable or photocrosslinkable polymer, respectively.

The photoactive polyvinyl chloride plastisol is preferably present in the form of an element comprising a substrate bearing a layer of the thermally coalescible photoactive plastisol as described above.

In accordance with another embodiment of this invention a positive image is formed by a process which comprises exposing imagewise an element comprising a substrate bearing a layer of the thermally coalescible photoactive plastisol as described above, heating to coalesce the plastisol in the unexposed image areas, and removing the plastisol in the exposed image areas by washing said areas with a solvent for the plasticizer component of the plastisol.

In accordance with still another embodiment of this invention a negative toned image is formed by a process which comprises exposing imagewise an element comprising a substrate bearing a layer of the thermally coalescible photoactive plastisol as described above, heating to coalesce the plastisol in the unexposed image areas, and applying colorant particles to the imagewise exposed surface, the particles selectively adhering to the exposed image areas.

The plastisol dispersions of this invention contain no more than 10% by weight of a volatile diluent. The polymers suitable for use as the resin component in the plastisol dispersions are homopolymers and copolymers of vinyl chloride having attached to the polymer backbone pendant groups that include reactive sites capable of activation by actinic radiation or free radicals to effect either crosslinking of neighboring polymer chains or addition polymerization of the initial chains to longer chains. Examples of suitable pendant groups include: anhydride, carbonyl, carboxyl, isocyanate, methylol or ethylenically unsaturated substituents. Vinyl chloride polymers have been found to be especially suited for use in plastisols because of their economy as well as their compatibility with a variety of plasticizers and their relative ease in compounding, forming and coalescing such plastisol dispersions. The preparation of the vinyl chloride polymers having polymerizable or crosslinkable groups in amounts of 0.1 to 16% by weight based on the total weight of polymer is within the competence of a skilled chemist. Representative useful polymeric compounds are:

1. Vinyl chloride (84 to 99.9% by weight)/acrylic or methacrylic acid (0.1 to 16% by weight) copolymer modified with hydroxy containing benzophenones, cinnamates, acrylates, or methacrylates, e.g., polyvinyl chloride modified with a 4-acryloxybenzophenone;

2. Vinyl chloride (84 to 99.9% by weight)/vinyl alcohol (0.1 to 16% by weight)/vinyl acetate (0 to 11.9% by weight) copolymers modified with cinnamates, benzophenones, acrylates or methacrylates, or isocyanates that incorporate the acrylate or methacrylate moiety in their structure;

3. Vinyl chloride (84 to 99.9% by weight)/maleic anhydride (0.1 to 16% by weight) copolymers modified to the ester or half ester with hydroxy-containing cinnamates, benzophenones, acrylates or methacrylates, e.g., 2-hydroxyethylacrylate or methacrylate.

These polymer compounds are illustrated by the following formulae wherein n, m and o are integers in an amount to provide polymer molecular weights in the range of 10,000 to 150,000; R and R', which can be the same or different, are H, $CH_3$ to $C_8H_{17}$, $OCH_3$ to $OC_8H_{17}$, Cl, Br; R'' is H or $CH_3$; and R''' is $CH_3$ to $C_8H_{17}$.
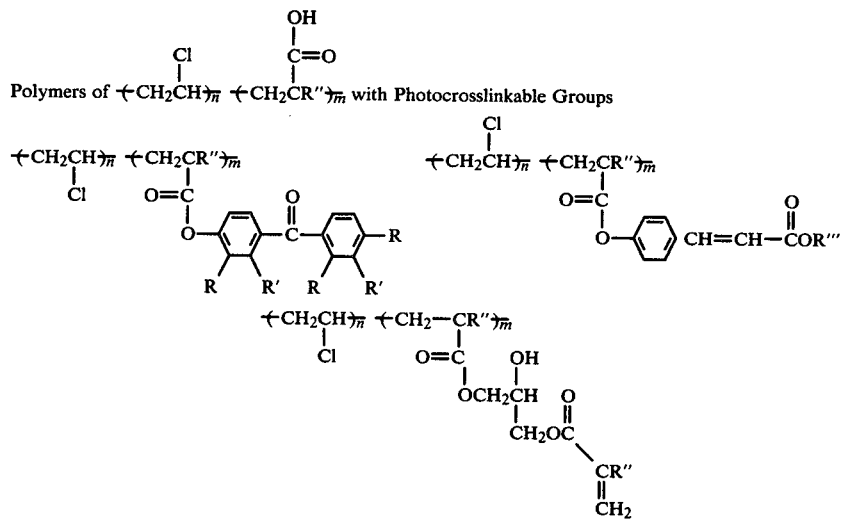
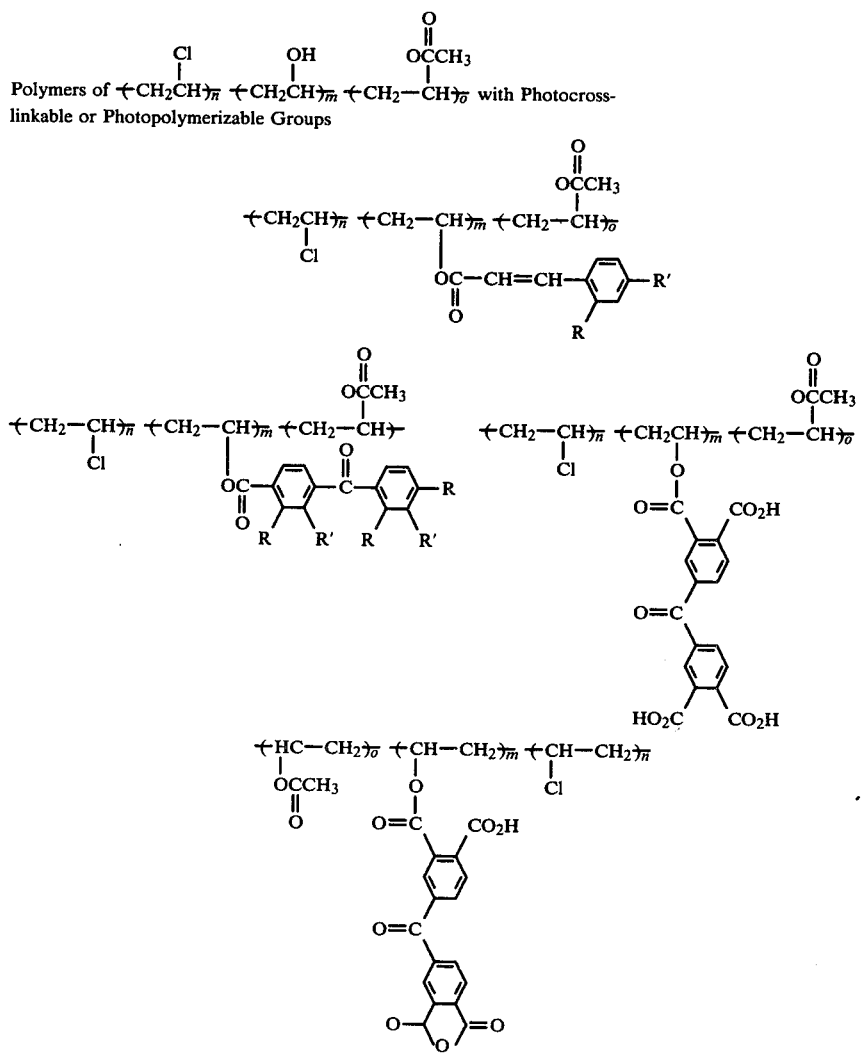

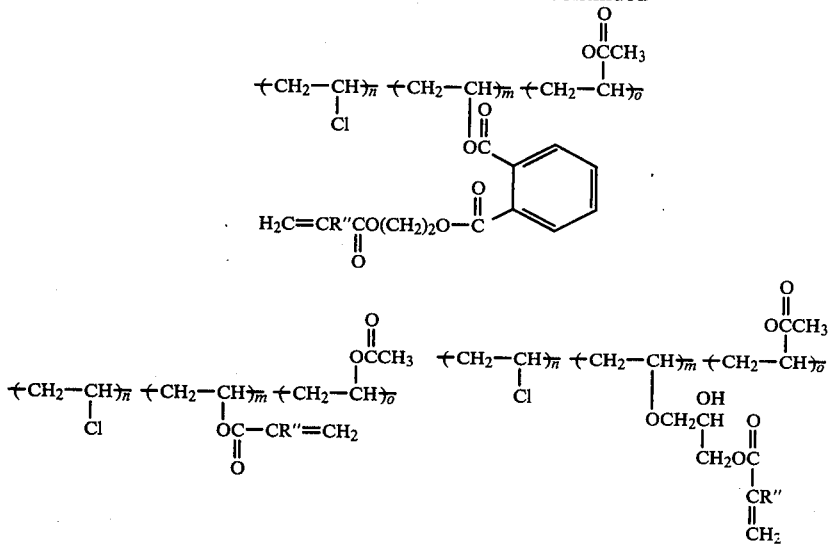

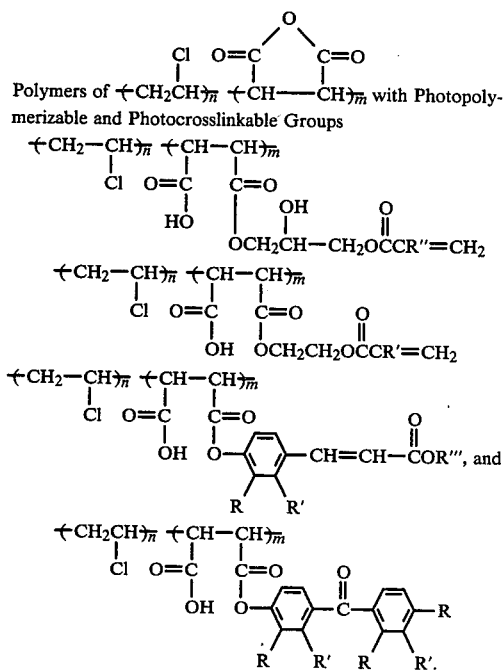

The method of making the basic polymers and their modification is not a part of the present invention, but will, as recognized, have an effect on such characteristics as the inherent viscosity of the polymer and the size of the polymer particles produced. The inherent viscosity of the polymer is preferably in the range 0.1–1.2 and more preferably 0.2–1.0. When polymer viscosity is high, the dispersion will be more difficult to coalesce; when polymer viscosity is low, the form stability of the final coalesced product may be affected adversely. Particle size, expressed as mean diameter of the particles, is preferably in the range 0.1–20 μm, and more preferably 0.5–10 μm. The desirable particle size in a given instance will be governed in part by the characteristics sought in the final product and by the forming procedures to be employed. Very small particles, e.g., <0.1 μm, are operable, but their large available surface area tends to make them susceptible to rapid gelation with consequent short storage life, and to require large amounts of plasticizer that result in low solids/liquid ratios that are inefficient and undesirable for practical operations. Very large particles may limit the minimum thickness of coatings that can be made from dispersions containing them, and may also require fusion or coalescence times that are unattractively long and/or severe. Particle sizes in the desired range in a given instance may be obtained either directly, by choice of an appropriate polymerization procedure, or by grinding or milling large particles to produce smaller ones, in equipment and by techniques known in the art.

To make the photoactive polymer dispersions of this invention, the modified polymer particles are dispersed in a medium that comprises a plasticizer for the modified polymer particles, i.e., a compatible liquid that is nonvolatile at room temperature and is not a solvent for the modified polymer particles under ordinary storage conditions, e.g., room temperature, but that is capable of interacting physically with the polymer in such a way as to reduce the mutual attractive forces between polymer chains, thereby increasing the workability and flexibility of the polymer. The plasticizer can be chosen from a large number of substances known to be plasticizers for polymers, e.g., phosphates, phthalates, sebacates, ricinoleates, adipates, etc. Plasticizers are discussed in Sarvetnick, "Plastisols and Organosols", Van Nostrand Reinhold Company, New York (1972), Chapter 3, pp. 33–59. Representative materials include: triallyl, tributyl and tricresyl phosphates; dibutyl, dicapryl and dioctyl phthalates; and others shown in the examples hereinafter. The plastisol dispersions are prepared by mixing the modified polymer particles into the plasticizer with sufficient shearing action to insure thorough dispersion of the polymer particles.

The dispersing medium may also contain up to 10% by weight of the total weight of the dispersion of a volatile component, preferably one that is a solvent or swelling agent for the modified polymer component of the dispersion. Incorporation of a volatile component provides an additional means of controlling the viscosity of the dispersion and may frequently facilitate the forming operation, e.g., coating, and improve the rheology of the dispersion. Representative materials are halogenated hydrocarbons such as methyl chloroform, chloroform, methylene chloride, trichloroethylene, tetrachloroethylene and carbon tetrachloride.

The loading factor or amount of polymer solids in the liquid dispersing medium will be governed by practical factors relating to operating convenience. For coatability, ease of stirring, and the like, a preferred polymer solids/nonvolatile liquid plasticizer weight ratio is 70/30 to 30/70, and more preferably about 60/40 to 40/60, for the plastisol dispersions.

The photoactive plastisol dispersions of the invention also contain a photoinitiator, i.e., a photoactivated free-radical-generating agent to effect crosslinking or addition polymerization of the modified polymer chains upon exposure. The initiator may be a single component or may comprise a multiple-component initiator system in an amount of up to 5% by weight based on the weight of polymer present in the dispersion. There also may be included hydrogen donor agents and chain transfer agents, as understood by those familiar with the photopolymer art. Among the useful initiators are photoreducible dyes, such as those described in U.S. Pat. Nos. 2,850,445 and 2,875,047, e.g., Methylene Blue (C.I. 52015) ["Colour Index", Third Edition, The Society of Dyers and Colourists, Bradford, Yorkshire, England (1971)] and Erythrosin B (C.I. 45430). Other useful materials, although some of them may be thermally active at temperatures as low as 85° C., include: vicinal ketaldonyl compounds, e.g., diacetyl, venzil; α-ketaldonyl alcohols, e.g., benzoin, pivaloin; acyloin ethers, e.g., benzoin methyl and ethyl ethers; α-hydrocarbon-substituted aromatic acyloins, e.g., α-methylbenzoin, α-allylbenzoin, α-phenylbenzoin. A more preferred class of photoinitiators, thermally inactive at and below 185° C., are the substituted or unsubstituted polynuclear quinones having two intracyclic carbonyl groups attached to intracyclic carbon atoms in a conjugated carbocyclic ring system, as disclosed in U.S. Pat. No. 2,951,758. Still more preferred, particularly because they enhance the photospeed of the dispersions containing them, are the dimers described in U.S. Pat. No. 3,479,185, and in particular the 2,4,5-triphenyl-imidazolyl dimers consisting of two lophine radicals bound together by a single covalent bond, and more especially such dimers having an ortho substituent on the 2-phenyl ring. The lophine dimers may also be used advantageously with hydrogen-donor compounds of the Michler's ketone type as disclosed in U.S. Pat. No. 3,549,367.

The hydrogen-donor component of the composition, if present, is a compound which has a reactive atom, usually hydrogen, which is removable to yield a radical that will react with addition polymerizable groups formed from ethylenically unsaturated monomers to initiate growth of polymer chains or with crosslinkable groups formed from ethylenically unsaturated polymeric compounds to initiate crosslinking. Some of these materials may be referred to as electron-donor agents. Useful and preferred hydrogen-donor compounds, as described in U.S. Pat. Nos. 3,418,118 and 3,479,185, include: amines, including secondary and tertiary amines, and especially the aromatic tertiary amines having at least one $CH_2$ group adjacent to the nitrogen atom; amine-substituted leuco dyes, especially those having at least one dialkylamino group; and leuco triphenylamine dyes or various salts (e.g., HCl salts) thereof. Representative materials include n-phenylglycine, acetoacetanilide, 4-acetamidothiophenol, and 2-mercaptobenzimidazole.

If desired, the photosensitive dispersions of this invention may also include chain transfer agents or polymerization accelerators, such as one or more of the agents disclosed in U.S. Pat. No. 3,046,127.

A separate photoinitiator component is not required when the modified polymer has pendant groups that contain moieties that are themselves photoactivatable producing free radicals that can initiate crosslinking or addition polymerization, e.g., pendant phenone or cinnamate groups. For polymers with such built-in initiator groups, it may be desirable, however, to employ known sensitizers, e.g., Michler's ketone, to enhance the photospeed of the composition. Adjuvant photoinitiators, as described above, can be added to supplement such built-in initiator groups.

In the event the initiator component(s) is not soluble in the plasticizer, it may be dissolved in a suitable volatile solvent that is compatible with the plasticizer, e.g., tetrahydrofuran, methylene chloride, then the solution of initiator component(s) can be added to the plasticizer and the volatile solvent removed, e.g., by evacuation with or without heat, before the modified polymer particles are dispersed in the liquid medium.

The photoactive dispersions of this invention may also include a variety of additives such as dyes, pigments, thermographic compounds, fillers and thickeners, for such purposes as modifying the physical properties of the final imaged element or of rendering the exposed and developed image more readily visible.

The photoactive dispersions of this invention can be formed into photoactive imaging elements by conventional forming procedures, such as coating and extrusion. The dispersions may be cast or extruded to form self-supporting elements, or they may be cast or coated on transparent or nontransparent substrates to form supported photoactive elements. For convenience in handling, the photoactive dispersion is preferably coated on a sheet support. Suitable materials include films composed of high polymers such as polyamides, e.g., polyhexamethylene sebacamide, polyhexamethylene adipamide; polyolefins, e.g., polyethylene, polypropylene; polyesters, e.g., polyethylene terephthalate, polyethylene terephthalate/isophthalate; vinyl polymers, e.g., vinyl acetals, vinylidene chloride/vinyl chloride copolymers, polystyrene, polyacrylonitrile; and cellulosics, e.g., cellulose acetate, cellulose acetate/butyrate, cellophane. A particularly preferred support material is polyethylene terephthalate film of the kind described in U.S. Pat. Nos. 2,627,088 and 2,779,684, with or without the surface coating described in the former patent. Where the particular application does not require the base support to be transparent, the photoactive dispersion may usefully be coated on an opaque support, such as paper, especially water-proof photographic paper; thin metal sheets, especially aluminum and copper sheets; cardboard; etc. The support used may also have in or on its surface and beneath the photoactive stratum an antihalation layer or other substrate needed to facilitate anchorage of the photoactive stratum to the base.

To facilitate storage and handling, it may frequently be desirable to apply a cover layer, which may be either an additional coating or a previously cast film. A convenient and suitable material is any of the several commercially available varieties of polyethylene film. Alternatively, any of a number of readily soluble polymeric materials, e.g., cellulose acetate, may be coated in solution over the photoactive stratum to leave, after removal of solvent, a hard, dry, nontacky surface. Depending on the degree of tackiness of the photoactive stratum, the protective layer may be left in place during exposure or not, as desired. If it is to be left in place, the material selected should have good optical clarity.

In carrying out the processes of this invention, a photoactive element, prepared as just described, is imagewise exposed to radiation to which the particular photoinitiator or initiator system used will respond, usually ultraviolet radiation, at an intensity and for a time sufficient to bring about crosslinking or addition polymerization of the dispersed polymer. The exact exposure conditions will depend, of course, on the various components selected for use in the photoactive layer, the optical density of the original image to which the photosensitive element is exposed, the read-out conditions to be employed, etc. In general, exposure times range from 1 to 20 minutes or more using standard commercial radiation sources.

The exposed photoactive element is then coalesced by heating in the general manner known in the art for simple polyvinyl chloride plastisols. The time and temperature of heating will be governed by such factors as the particular polymer and plasticizer chosen, the particle size of the polymer particles, and the loading factor of polymer in the plasticizer. In general heating temperatures in the range of 120° to 170° C., preferably about 150° C. are used for periods of about 10 to 180 seconds or more.

After the coalescence step, any cover sheet that may have been present originally, left in place during the exposure step, is removed, and the exposed photoactive element is developed by either of two general read-out procedures, depending on whether a positive or negative image is desired.

A positive image is formed when the exposed and coalesced element is subjected to a solvent washout or development procedure, carried out by relatively simple washing, spraying or scrubbing techniques known per se in the photopolymer art. The wash-out agent is a solvent for the plasticizer. During wash-out the polymeric component is also removed in the exposed image areas, e.g., by mechanical action of the plasticizer solvent. The mechanism of the positive-image procedure depends on the fact that the final crosslinked or further-polymerized polymer that results from exposure is not soluble in the plasticizer, hence, the heating step cannot fuse or coalesce the composition in the imagewise exposed areas. Thus, the composition in the exposed image areas can subsequently be removed by suitable solvents, whereas the composition in unexposed image areas is converted by the heating or coalescence step to a hard, translucent, insoluble material. The solvent to be used for the wash-out step will depend, of course, on the particular plasticizer used. Representative suitable solvents include tetrahydrofuran, chloroform, heptane, dioxane and methylene chloride, chloroethane, dimethyl formamide, etc. Mixtures of solvents can be used.

A negative image is formed when the exposed and coalesced element is dusted or toned with particulate colorants such as those commonly used in the xerographic art or in the photopolymer art for toning proofing films, and the like. The toners may be pigments or they may be resin particles infused with colorants, which may be either dyes or pigments. A number of suitable materials are commercially available. The particular nature of the toner is not a feature of the present invention. The mechanism of the negative-image procedure likewise depends on the fact that the photocrosslinked or photopolymerized composition in exposed areas cannot be fused or coalesced in the heating step, whereas the composition in unexposed areas is converted to a hard material. Thus, the exposed areas remain somewhat soft and tacky, hence, capable of accepting and retaining the toner particles, while unexposed areas will not do so. By treating the exposed surface gently with one of the solvents described above an increased amount of toner can be made to adhere to the exposed image areas. Toning of the exposed areas, of course, results in a negative of the original image to which the photosensitive element was exposed.

Prior to development or read-out by either wash-out or toning as described above, the element may be given optionally a nonimagewise postexposure, e.g., 10 to 120 seconds, to harden the originally unexposed areas, thereby to improve durability and stability of the final imaged element.

BEST MODE FOR CARRYING OUT THE INVENTION

The best mode is illustrated in Example 6 wherein the photoactive, thermally coalescible polyvinyl chloride polymer of the plastisol dispersion has acrylate groups attached to the polymer backbone. A positive image is formed upon imagewise exposure of a layer of the plastisol to an actinic radiation source, the exposed layer is heated and the exposed image areas are washed out.

INDUSTRIAL APPLICABILITY

The photoactive, thermally coalescible polyvinyl chloride plastisol dispersions are easily prepared using readily available substituents and are formed in photoactive elements by solvent-free procedures with obvious economic and ecological advantages. The element or a self-supporting layer of the plastisol provide a versatile imaging element which provides either positive or negative image capability. The positive washed out product is particularly useful as a resist, e.g., microcircuits; printing plate, lithographic or relief. The negative toned product is useful for color proofing.

EXAMPLES

The invention is illustrated by the following examples wherein the parts and percentages are by weight unless otherwise noted.

EXAMPLE 1

Preparation of 4-Acryloxybenzophenone: A 100 g quantity of 4-hydroxybenzophenone was added to 500 ml of water containing 22.0 g of sodium hydroxide. The solution was stirred until all of the benzophenone had dissolved. After the solution had cooled to 5°–10° C., there was added 45.5 g of acrylyl chloride over a period of 30 minutes, to yield a white solid which was recovered by filtration after the solution had been stirred for 2 hours at 5°–10° C. and an additional hour at room temperature. The white solid was recrystallized from ethanol and found to have m.p. 44°–46° C. Infrared and NMR spectra confirmed the structure of 4-acryloxybenzophenone.

Preparation of Vinyl Chloride/4-Acryloxybenzophenone Copolymer: A self-initiating photosensitive polymer was prepared from the following solutions:

| Solution A | |
|---|---|
| Ammonium stearate | 7.0 g |
| Ammonium persulfate | 1.4 g |
| Sodium hydrogen sulfite | 0.7 g |
| Disodium hydrogen phosphate | 2.0 g |
| Water | 1400 ml |
| Solution B | |
| 4-Acryloxybenzophenone | 60 g |
| Acetone | 400 ml |

Half of Solution A was placed in a high-pressure reaction vessel equipped with a pressure-equalizing addition vessel. The reaction vessel was flushed with nitrogen and 280 g of vinyl chloride were added. After the solution in the vessel had been heated to 50° C., addition of Solution B was begun at a rate of 30 ml/hour. After two hours of such addition, there were added an additional 280 g of vinyl chloride and 450 ml of Solution A, and the addition of Solution B was continued. After another 2 hours, an additional 280 g of vinyl chloride and the remainder of Solution A were added, and the addition of Solution B was continued until it had all been added. The resulting polymer product was filtered, washed with water, washed with methanol to remove unreacted 4-acryloxybenzophenone, and dried in a vacuum oven for 24 hours at 50° C. Infrared and ultraviolet spectra confirmed the structure of a vinyl chloride/4-acryloxybenzophenone copolymer containing 2.7 mol % of 4-acryloxybenzophenone.

Preparation and Use of Plastisol: A 5.0 g quantity of the copolymer was ball-milled to reduce particle size about 0.5 to 1.5$\mu$ and was then mixed with 2.5 g of di-n-butyl phthalate until good dispersion was achieved. A small portion of the plastisol formed was placed on an aluminum plate and covered with a sheet of 0.007 inch-thick [0.18 mm] polyethylene terephthalate film, and this laminated structure was placed in a press and subjected to a pressure of 10,000 lbs./in.$^2$ [~700 kg/cm$^2$] for 1 minute. The photosensitive plastisol imaging element so made was exposed through a process transparency to xenon-arc radiation [nuArc ® Plate Maker of the flip-top type, Model FT-261, manufactured by the nuArc Co., Inc., Chicago, Ill.] for 20 minutes. The exposed element was then heated at 150° C. for ~15 seconds on a laboratory hot plate, whereupon fusion or coalescence of the plastisol occurred in the unexposed areas. The polyethylene terephthalate cover sheet was removed and the element was washed by simple washing or by spray washing with tetrahydrofuran to remove the plastisol composition from the exposed, uncoalesced areas, leaving a positive image of coalesced plastisol composition in the unexposed, coalesced areas.

EXAMPLE 2

A 20-gram portion of the vinyl chloride/4-acryloxy benzophenone copolymer described in Example 1 was ground in a laboratory grinder until it passed through a 284-mesh [~50 $\mu$m] screen, then this portion was mixed with 12.5 g of di-n-butyl phthalate until a plastisol was achieved. A phosensitive plastisol imaging element was prepared by pressing a small quantity of the plastisol between an aluminum plate and a sheet of polyethylene terephthalate film as described in Example 1, but at a pressure of 15,000 lbs./in.$^2$ [~1050 kg/cm$^2$]. After exposure to a xenon arc through a process transparency followed by heating at 150° C. for ~10 seconds, all as described in Example 1, the polyethylene terephthalate cover sheet was removed. The exposed, coalesced element was then toned with a commercially available red toner, Duol Carmine, RT-443-D, C.I. 15850 which adhered to the exposed, uncoalesced areas but did not adhere to the unexposed, coalesced areas, thereby forming a negative of the original image to which the element had been exposed. Additional elements, prepared and exposed as just described, were coalesced at 150° C. at heating times of 1, 2, 3 and 4 minutes. An increased amount of toner was made to adhere to the exposed areas when the samples were washed lightly with tetrahydrofuran before original application of the toner.

EXAMPLE 3

A self-initiating photosensitive copolymer was prepared from the following solutions:

| Solution A | |
|---|---|
| Ammonium stearate | 7.0 g |
| Ammonium persulfate | 1.4 g |
| Sodium hydrogen sulfite | 0.7 g |
| Disodium hydrogen phosphate | 1.05 g |
| Water | 1400 ml |
| Solution B | |
| 4-Acryloxybenzophenone | 60 g |
| Acetone | 130 ml |

A 700-ml portion of Solution A was placed in a high-pressure reaction vessel equipped with a pressure-equalizing addition vessel. The reaction vessel was flushed with nitrogen and then with vinyl chloride. A 280 g portion of vinyl chloride was added and the solution was stirred at 50° C. while 50 ml of Solution B were added over a period of one hour. There were then added 280 g of vinyl chloride and 350 ml of Solution A, then a 40 ml portion of Solution B was added over a period of one hour while the stirred solution was maintained at 50° C. There were then added another 280 g of vinyl chloride and the remaining 350 ml of Solution A, the the final 40 ml portion of Solution B was added over a period of one hour while the stirred solution was maintained at 50° C. When all additions were complete, the solution was stirred an additional two hours at 50° C. After filtration, the polymer was washed with water, washed with methanol to remove unreacted 4-acryloxybenzophenone, dried, ball-milled with steel balls for 12 hours, then passed through a laboratory cutter set at 283 mesh [~50 $\mu$m]. Infrared and ultraviolet spectra indicated a vinyl chloride/4-acryloxybenzophenone copolymer containing 3.4 mol % of 4-acryloxybenzophenone.

A 5.0 g portion of the polymer powder, which had been further ball-milled with steel balls for 3 days to reduce the particles to 0.3 to 1.0$\mu$ was stirred with 3.0 g of di-n-butyl phthalate over a period of 20 minutes to give a uniform plastisol mixture. An imaging element was prepared from this plastisol as described in Example 2. The element was exposed through a process transparency for 20 minutes to xenon-arc radiation, heated at 150° C. for 10 seconds, and washed with tetrahydrofuran to give a positive image, all as described in Example 1.

In further repetitions of the procedure, all at an exposure time of 20 minutes, positive images were obtained after washing with methylene chloride, methylene chloride/tetrahydrofuran and dioxane.

EXAMPLE 4

A plastisol was made by stirring 10 g of the self-initiating photosensitive copolymer of Example 3 into 6.5 g of di-n-butyl phthalate, and the plastisol was used to make a number of imaging elements as described in Example 2. Negative images were obtained with two elements exposed through a process transparency, respectively, for 15 and 20 minutes to xenon-arc radiation, heated at 150° C. for 10 seconds as described in Example 2. The exposed, coalesced element was then toned with Harmon Colors, Thiofast Red, MV 6606, C.I. 73312.

Negative images were obtained in every case with additional elements, all exposed for 20 minutes, then heated at 150° C. for, respectively, 1, 2, 3, 4 and 5 minutes, then toned.

EXAMPLE 5

A self-initiating photosensitive copolymer was made from a Solution A having the same composition as Solution A in Example 1 and a Solution B made up of 50 g of 4-acryloxybenzophenone in 400 ml of acetone. By procedures substantially like those of Example 1, these solutions were used to prepare a vinyl chloride/4-acryloxybenzophenone copolymer containing 1.7% of 4-acryloxybenzophenone. The polymer was ball-milled with steel balls for 48 hours.

A plastisol was made from 3 g of the copolymer powder and 6 g of tritolylphosphate, then formed into imaging elements as in Example 1 except that the laminated structure was pressed at 30,000 lbs./in.$^2$ [~2100 kg/cm$^2$]. The elements were exposed through a process transparency by xenon-arc radiation, heated at 150° C., and washed with tetrahydrofuran. Positive images were obtained with elements (a) exposed for 20 minutes and heated for 1 and 3 minutes, and (b) exposed for 30 minutes and heated for 1 and 3 minutes.

Another plastisol, made from 5 g of the same copolymer powder and 4.1 g of di-n-butyl phthalate, was formed into imaging elements in the same manner as described above except that the laminated structure was pressed at 15,000 lbs./in.$^2$ [~1050 kg/cm$^2$]. Elements exposed through a process transparency as before for 20 minutes and heated at 150° C. for 1 and 2 minutes gave positive images when washed with tetrahydrofuran.

EXAMPLE 6

In a flask fitted with a stirrer and an addition funnel, there was prepared a solution of 400 g of a vinyl chloride/vinyl alcohol/vinylacetate (91/6/3) copolymer (M.W. 23,000) in 2 liters of tetrahydrofuran under a nitrogen atmosphere. To this was added 84 g of triethyl amine. A solution of 72 g of acrylyl chloride in 75 ml of tetrahydrofuran was then added over a period of 30 minutes while the solution was stirred, and stirring was continued for a further two hours after the addition was completed. The reaction mixture was then filtered to remove the amine salt, and the filtrate was added to water to precipitate the acrylated vinyl chloride copolymer. The recovered copolymer was washed with water, dried, and ground to a fine powder having an average particle size of <1.3 μm.

A solution was prepared containing:

| | |
|---|---|
| Bis[2-o-chlorophenyl-4,5-bis(m-methoxyphenyl)]imidazole | 1.0 g |
| 2-Mercaptobenzoxazole | 0.5 g |
| Methylene chloride | 5 ml |

This solution was thoroughly mixed with 25 g of di-n-butyl phthalate, then the methylene chloride solvent was removed by evacuation. There was then added 25 g of the above described copolymer powder with stirring. The resulting plastisol was made into imaging elements as previously described under a pressure of 40,000 lbs./in.$^2$ [~2800 kg/cm$^2$]. A positive image resulted when the element was exposed to xenon-arc radiation through a process transparency for 2 minutes, heated at 150° C. for ~10 seconds, and washed with chloroform.

EXAMPLE 7

A number of imaging elements were prepared at a pressure of 20,000 lbs./inc.$^2$ [1400 kg/cm$^2$] from a plastisol having the following composition:

| | |
|---|---|
| Copolymer of Example 6 | 25.0 g |
| Di-n-butyl phthalate | 25.0 g |
| Benzoin methyl ether | 3.0 g |

When a number of these elements were exposed through a process transparency to xenon-arc radiation for various times, heated at 150° C. for various times, and washed with chloroform/heptane(75/25), positive images with satisfactory quality were obtained under the following conditions:

| Exposure Time, Min. | Heating Time, Sec. |
|---|---|
| 1 | 20 |
| 2 | 10 |
| 3 | 30 |
| 4 | 60 |
| 5 | 120 |
| 10 | 180 |

Another group of imaging elements made in the same way from a plastisol of the same composition were exposed through a process transparency to xenon-arc radiation for 2 minutes, heated at 150° C. for 10 seconds, then given a nonimagewise postexposure to a 120-watt high-pressure mercury lamp for various times, and finally washed with chloroform, with the following results:

| Postexposure Time, Sec. | Image Quality |
|---|---|
| 10 | Good |
| 15 | Good |
| 20 | Good |
| 30 | Good |
| 60 | Satisfactory |
| 120 | Satisfactory |

Still another group of elements made in the same way from a plastisol of the same composition were exposed through a process transparency to xenon-arc radiation for 2 minutes, heated at 150° C. for various times indicated below, nonimagewise postexposed to the mercury lamp for 10 seconds, and washed with chloroform.

Good images were obtained at heating times of 5, 10, 20, 30 and 60 seconds.

Still another group of elements made in the same way from a plastisol of the same composition was exposed through a process transparency to xenon-arc radiation for 2 minutes, heated at 150° C. for 10 seconds, nonimagewise postexposed to the mercury lamp for 10 seconds, and washed with various solvents. Good positive images were obtained with chloroform, tetrahydrofuran, and mixtures of these two solvents.

EXAMPLE 8

Five plastisols were made containing various amounts of the copolymer powder of Example 6 dispersed in a liquid medium that contained 2.5 g of di-n-butyl phthalate and 0.3 g benzoin methyl ether. Imaging elements made from these plastisols as described in Example 7 were exposed to xenon-arc radiation through a process transparency for 2 minutes, heated at 150° C. for 10 seconds, nonimagewise postexposed to the mercury lamp for 10 seconds, and washed with chloroform, with the following results:

| Copolymer Amount, g | Image Quality |
| --- | --- |
| 2.5 | Good |
| 3.0 | Good |
| 4.0 | Satisfactory |
| 5.0 | Satisfactory |
| 10.0 | Satisfactory |

EXAMPLE 9

Four plastisols were made containing 5.0 g of the copolymer powder of Example 6 dispersed in a liquid medium that contained 0.3 g of benzoin methyl ether and various amounts of di-n-butyl phthalate. Imaging elements were made, exposed, and washed as described in Example 8, with the following results:

| Plasticizer Amount, g | Image Quality |
| --- | --- |
| 2.5 | Satisfactory |
| 8.5 | Good |
| 12.5 | Good |
| 15.5 | Satisfactory |

EXAMPLE 10

Five plastisols were made containing 2.5 g of the copolymer powder of Example 6 dispersed in a liquid medium that contained 2.5 g of di-n-butyl phthalate and various amounts of benzoin methyl ether. Imaging elements were made, exposed, and washed as described in Example 8, with the following results:

| Initiator Amount, g | Image Quality |
| --- | --- |
| 0.1 | Satisfactory |
| 0.3 | Good |
| 0.5 | Good |
| 0.75 | Good |
| 1.0 | Good |

EXAMPLE 11

Four plastisols were made containing 2.5 g of the copolymer powder of Example 6 dispersed in a liquid medium that contained 0.3 g of benzoin methyl ether and 2.5 g of various plasticizers. Imaging elements were made, exposed, and washed as described in Example 8, with these results:

| Plasticizer | Image Quality |
| --- | --- |
| Di-n-butyl phthalate | Good |
| Di-n-octyl phthalate | Good |
| Tricresyl phosphate | Good |
| Polyethylene glycol, MW = 300 | Good |

We claim:

1. A positive image forming process which comprises
    (a) exposing imagewise a photoactive element comprising a substrate bearing a layer of a photoactive, thermally coalescible polyvinyl chloride resin plastisol dispersion consisting essentially of (a) particles having a mean diameter in the range of 0.1 to 20 $\mu$m of a solid polyvinyl chloride polymer having attached to the backbone thereof photopolymerizable or photocrosslinkable groups taken from the group consisting of anhydrides, carbonyl, carboxyl, isocyanate, methylol and ethylenically unsaturated substituents in amounts of 0.1 to 16% by weight based on the total weight of polymer, the polymer having an inherent viscosity in the range of 0.1 to 1.2 and being dispersed in (b) a liquid medium compatible with the particles that comprises a plasticizer for the polymer and is nonvolatile at room temperature and has no substantial solvent activity for the polymer at room temperature and (c) a photoinitiator or photoinitiator system present either as a separate component or as a photoactive substituent on the polymer backbone, the photoinitiator or photoinitiator system being capable, upon exposure to actinic radiation, of causing polymerization or crosslinking of the photopolymerizable or photocrosslinkable polymer, respectively, the weight ratio of solid polymer (a) to weight ratio of plasticizer (b) being 70/30 to 30/70
    (b) heating the exposed element to coalesce the plastisol layer solely in the unexposed image areas, and
    (c) removing the plastisol layer in the exposed image areas by washing the areas with a solvent for the plasticizer component of the plastisol.

2. A negative image forming process which comprises
    (a) exposing imagewise a photoactive element comprising a substrate bearing a layer of a photoactive, thermally coalescible polyvinyl chloride resin plastisol dispersion consisting essentially of (a) particles having a mean diameter in the range of 0.1 to 20 $\mu$m of a solid polyvinyl chloride polymer having attached to the backbone thereof photopolymerizable or photocrosslinkable groups taken from the group consisting of anhydrides, carbonyl, carboxyl, isocyanate, methylol and ethylenically unsaturated substituents in amounts of 0.1 to 16% by weight based on the total weight of polymer, the polymer having an inherent viscosity in the range of 0.1 to 1.2 and being dispersed in (b) a liquid medium compatible with the particles that comprises a plasticizer for the polymer and is nonvolatile at room temperature and has no substantial solvent activity for the polymer at room temperature and (c) a photoinitiator or photoinitiator system present either as a separate component or as a photoactive substituent on the polymer backbone, the photoinitiator or photoinitiator system being capable, upon exposure to actinic radiation, of causing polymerization or crosslinking of the photopolymerizable or photocrosslinkable polymer, respectively, the weight ratio of solid polymer (a) to weight ratio of plasticizer (b) being 70/30 to 30/70, (b) heating the exposed element to coalesce the plastisol layer solely in the unexposed image areas, and (c) applying the colorant particles in the imagewise exposed surface, the particles selectively adhering to the exposed image areas.

3. A process according to claim 1 wherein prior to step (c), the exposed image surface is nonimagewise exposed.

4. A process according to claim 2 wherein prior to step (c), the exposed image surface is nonimagewise exposed.

5. A positive image forming process according to claim 1 which comprises
(a) exposing the photoactive element imagewise for at least one minute,
(b) heating the exposed element in the range of 120° to 170° C. for a period of 10 to 180 seconds to coalesce the plastisol layer solely in the unexposed image areas, and
(c) removing the plastisol layer in the exposed image areas by washing the areas with a solvent for the plasticizer component of the plastisol.

6. A process according to claim 5 wherein the washout solvent is taken from the group consisting of tetrahydrofuran, chloroform, hexane, dioxane, methylene chloride, chloroethane and dimethylformamide.

7. A negative image forming process according to claim 2 which comprises
(a) exposing the photoactive element imagewise for at least one minute,
(b) heating the exposed element in the range of 120° to 170° C. for a period of 10 to 180 seconds to coalesce the plastisol layer solely in the unexposed image areas, and
(c) applying toner particles to the imagewise exposed surface, the particles selectively adhering to the exposed image areas.

8. A process according to claim 5 wherein prior to step (c) the exposed image surface is nonimagewise exposed for 10 to 120 seconds.

9. A process according to claim 7 wherein prior to step (c) the exposed image surface is nonimagewise exposed for 10 to 120 seconds.

10. A positive image forming process according to claim 1 wherein the photoactive thermally coalescible polyvinyl chloride plastisol particles (a) are solid polyvinyl chloride polymer particles having attached to the polymer backbone photopolymerizable groups of acrylates and methacrylates, and the photoinitiator or photoinitiator system (c) is present as a separate component.

11. A negative forming process according to claim 2 wherein the photoactive thermally coalescible polyvinyl chloride plastisol particles (a) are solid polyvinyl chloride polymer particles having attached to the polymer backbone photopolymerizable groups of acrylates and methacrylates, and the photoinitiator or photoinitiator system (c) is present as a separate component.

* * * * *